(12) United States Patent
Ogawa et al.

(10) Patent No.: US 7,745,736 B2
(45) Date of Patent: Jun. 29, 2010

(54) INTERCONNECTING SUBSTRATE AND SEMICONDUCTOR DEVICE

(75) Inventors: Kenta Ogawa, Kanagawa (JP); Jun Tsukano, Kanagawa (JP); Takehiko Maeda, Kanagawa (JP); Tadanori Shimoto, Tokyo (JP); Shintaro Yamamichi, Tokyo (JP); Kazuhiro Baba, Tokyo (JP)

(73) Assignees: NEC Electronics Corporation, Kanagawa (JP); NEC Corporation, Tokyo (JP)

( * ) Notice: Subject to any disclaimer, the term of this patent is extended or adjusted under 35 U.S.C. 154(b) by 1187 days.

(21) Appl. No.: 11/341,445

(22) Filed: Jan. 30, 2006

(65) Prior Publication Data

US 2006/0192287 A1    Aug. 31, 2006

(30) Foreign Application Priority Data

Feb. 7, 2005    (JP) .............................. 2005-031100

(51) Int. Cl.
*H01R 12/04* (2006.01)
*H05K 1/11* (2006.01)

(52) U.S. Cl. ...................................... 174/262; 174/254
(58) Field of Classification Search ................ 174/254, 174/262
See application file for complete search history.

(56) References Cited

U.S. PATENT DOCUMENTS 6,429,385 B1 *   8/2002   Tandy ......................... 174/260
6,797,367 B2 *   9/2004   Ogawa et al. ................ 428/209
6,815,619 B2 *  11/2004   Iwasaki et al. .............. 174/255
6,835,897 B2 *  12/2004   Chang et al. ................. 174/255
6,864,434 B2 *   3/2005   Chang et al. ................. 174/255
7,321,099 B2 *   1/2008   Mishiro ....................... 174/260

FOREIGN PATENT DOCUMENTS

| JP | 8-51258      | 2/1996  |
|----|--------------|---------|
| JP | 11-163022    | 6/1999  |
| JP | 11-177191    | 7/1999  |
| JP | 2000-3980    | 1/2000  |
| JP | 2000-323613  | 11/2000 |
| JP | 2000-353863  | 12/2000 |
| JP | 2002-33555   | 1/2002  |
| JP | 2002-83893   | 3/2002  |
| JP | 2002-198462  | 7/2002  |
| JP | 2004-179647  | 6/2004  |
| JP | 2005-327780  | 11/2005 |

* cited by examiner

*Primary Examiner*—Ishwarbhai B Patel
(74) *Attorney, Agent, or Firm*—Young & Thompson

(57) ABSTRACT

An interconnecting substrate is provided with a base insulating film having a sunken section in a bottom surface thereof, a first interconnection provided in the sunken section, a via hole formed in the base insulating film, and a second interconnection which is connected to the first interconnection via a conductor within the via hole and is formed on a top surface of the base insulating film, wherein the interconnecting substrate includes a first interconnection pattern formed of the first interconnection which includes at least a linear pattern which extends along a second direction orthogonal to a first direction, and a warpage-controlling pattern which is provided in the sunken section in the bottom surface of the base insulating film and is formed in such a manner as to suppress a warpage of the interconnecting substrate toward a bottom side on both sides of the first direction.

28 Claims, 14 Drawing Sheets

INTERCONNECTING SUBSTRATE AND SEMICONDUCTOR DEVICE

BACKGROUND OF THE INVENTION

1. Field of the Invention

The present invention relates to an interconnecting substrate used for carrying a semiconductor chip and a semiconductor device in which this interconnecting substrate is used.

2. Description of the Related Art

In recent years, as a result of an increase in the number of terminals and a narrower pitch due to the high performance design, multifunctional design and high density design of semiconductor devices, interconnecting substrates for packaging on which semiconductor devices are to be mounted have been required to provide high density and fine pitch design more than before.

A build-up printed substrate, which is a type of a multilayer interconnecting substrate, has hitherto been-mentioned as an interconnecting substrate for packaging which is widely used. In this builtup printed substrate, resin layers are formed on both surfaces of a glass epoxy printed substrate as a base core substrate, on which interconnections are formed, and in these resin layers, via holes are formed by the photolithography process and the laser process and then interconnection layers and via conductors are formed by the plating process and the photolithography process. A multilayer interconnection structure can be formed by repeating the resin layer forming step and the interconnection and via conductor forming step as required.

However, this builtup printed substrate has the problem that because of the use of a glass epoxy printed substrate of low heat resistance as the base core substrate, deformation, such as shrinkage, warpage and waviness, is apt to occur due to the heating during the formation of a multilayer structure and the carrying of a semiconductor chip.

On the other hand, the JP2000-3980A (Patent Document 1) discloses an interconnecting substrate for packaging in which a builtup laminated structure is formed on a base substrate made of a metal sheet.

FIGS. 9(a) to 9(d) each show a manufacturing process diagram of this interconnecting substrate for packaging. First, as shown in FIG. 9(a), insulating layer 502 is formed on metal sheet 501 and via hole 503 is formed in this insulating layer 502. Next, as shown in FIG. 9(b), interconnection pattern 504 is formed on insulating layer 502 in which via hole 503 is formed. Next, as shown in FIG. 9(c), insulating layer 506 is formed on interconnection pattern 504, and flip chip pad portion 505 which reaches interconnection pattern 504 is formed in this insulating layer 506. Lastly, as shown in FIG. 9(d), metal sheet 501 is etched from the bottom surface side and substrate-reinforcing body 507 and external electrode terminals 508 are formed.

However, because in this interconnecting substrate for packaging, external electrode terminals 508 are formed by the etching of metal sheet 501, it is difficult to narrow the pitch between external electrode terminals 508 due to limits to the control of the quantity of side etching during etching. Furthermore, when this interconnecting substrate for packaging is mounted on an external board and a device, structurally, stresses are concentrated on the interface between external electrode terminal 508 and insulating layer 502, thereby posing the problem that open faults tend to occur and hence sufficient reliability cannot be obtained.

An interconnecting substrate for packaging capable of solving the above-described problems in conventional techniques is disclosed in the JP2002-198462A (Patent Document 2).

This basic structure and its manufacturing method will be described by using FIGS. 10(a) and 10(b). First, electrode 602 is formed on support board 601 made of a metal sheet etc., and insulating layer 603 is formed so as to cover this electrode. Next, via hole 604 which reaches electrode 602 is formed in this insulating layer 603 and interconnection 605 is formed so as to bury this via hole. This interconnection 605 is connected to electrode 602 by a conductor buried in the via hole (FIG. 10 (a)). A multilayer interconnection structure can be formed by repeating the steps for forming an insulating layer, a via hole and an interconnection as required. Next, as shown in FIG. 10(b), electrode 602 is exposed by selectively removing part of support board 601 by etching and support body 606 is formed. Interconnecting substrate 607 can be formed in this manner. Although a case where a pad-like electrode pattern is formed has been described here, it is also possible to form a linear interconnection pattern in a similar way.

The thermal deformation of the interconnecting substrate can be suppressed by using a heat-resistant material such as metal in support body 606, and a interconnecting substrate excellent in strength can be obtained by using a resin material having a desired mechanical strength for the insulating layer. Furthermore, because the bottom surface is exposed, with the circumference of the conductor layer, such as the electrode and the interconnection, buried in the insulating layer, stresses applied to the conductor layer is suppressed during mounting and hence mounting reliability can be increased.

Also, insulating layer materials suitable for the above-described interconnecting substrate are disclosed in JP2004-179647A (Patent Document 3). For the purpose of providing an interconnecting substrate and a semiconductor package which possess high reliability, where the formation of cracks due to repeatedly applied thermal stresses are suppressed, this document discloses an insulating layer which has a film thickness of 3 to 100 µm, a fracture strength of not less than 80 MPa at 23° C. and values of the ratio (a/b) of not more than 4.5 when the fracture strength at −65° C. is denoted by "a" and the fracture strength at 150° C. is denoted by "b". In addition to this, it is specified that the modulus of elasticity at 150° C. is preferably not less than 2.3 GPa. Also, this document discloses that when the modulus of elasticity at −65° C. is denoted by "c" and the modulus of elasticity at 150° C. is denoted by "d", values of the ratio (c/d) are specified at not more than 4.7. Furthermore, this document discloses that values of the ratio (a/b) are specified at not more than 2.5, or values of the ratio (a/b) are specified at larger than 2.5 but not more than 4.5 and absolute values of a difference between the ratio (a/b) and the ratio (c/d) are specified at not more than 0.8.

However, an interconnecting substrate having a structure as described in Patent Document 2 had the problem that a warpage occurs after manufacture although it is excellent in heat resistance and mechanical strength according to the characteristics of an insulating material. For example, in a case where, from the standpoint of productivity, a block substrate in which region units that correspond to target interconnecting substrates are arrayed as blocks in one substrate is formed, a warpage occurs in such a manner that the whole of this block substrate is bent. This block substrate is transferred after its manufacture and is cut and divided into individual target packages that correspond to the target interconnecting substrates after mounting semiconductor chips on the block substrate. On that occasion, the warpage of the block substrate lowers transfer efficiency, and makes it difficult to perform precise mounting of semiconductor chips, thereby causing a decrease in throughput, yield and connection reliability.

SUMMARY OF THE INVENTION

Therefore, in view of the above-described problems, an object of the present invention is to provide an interconnecting substrate which has sufficient mechanical strength but in which warpage is controlled, and a semiconductor device in which this interconnecting substrate is used.

The present invention includes the following aspects described in items 1 to 22.

1. An interconnecting substrate comprising:
    a base insulating film having a sunken section in a bottom surface thereof,
    a first interconnection provided in the sunken section,
    a via hole formed in the base insulating film, and
    a second interconnection which is connected to the first interconnection via a conductor within the via hole and is formed on a top surface of the base insulating film,
    wherein the interconnecting substrate comprises
    a first interconnection pattern formed of the first interconnection which comprises at least a linear pattern which extends along a second direction orthogonal to a first direction, and
    a warpage-controlling pattern which is provided in the sunken section in the bottom surface of the base insulating film and is formed in such a manner as to suppress a warpage of the interconnecting substrate toward a bottom side on both sides of the first direction.

2. The interconnecting substrate described in item 1, wherein the first interconnection pattern has a component ratio of a Y-component extending along the second direction to an X-component extending along the first direction (Y/X) which is larger than 1 and the warpage-controlling pattern has a component ratio of the Y-component to the X-component (Y/X) which is smaller than 1.

3. An interconnecting substrate comprising:
    a base insulating film having a sunken section in a bottom surface thereof,
    a first interconnection provided in the sunken section,
    a via hole formed in the base insulating film, and
    a second interconnection which is connected to the first interconnection via a conductor within the via hole and is formed on a top surface of the base insulating film,
    wherein the interconnecting substrate comprises
    a first interconnection pattern formed of the first interconnection which comprises at least a linear pattern which extends along a second direction orthogonal to a first direction and has a component ratio of a Y-component extending along the second direction to an X-component extending along the first direction (Y/X) which is larger than 1, and
    a warpage-controlling pattern which is provided in the sunken section in the bottom surface of the base insulating film and has a component ratio of the Y-component to the X-component (Y/X) which is smaller than 1.

4. The interconnecting substrate described in item 1, 2 or 3, wherein the first interconnection pattern has an area ratio of a total of the linear pattern extending along the first direction and the linear pattern extending along the second direction to the whole first interconnection pattern which is not less than 60%.

5. The interconnecting substrate described in any one of items 2 to 4, wherein the component ratio (Y/X) of the first interconnection pattern is not less than 55/45.

6. The interconnecting substrate described in any one of items 1 to 5, wherein the warpage-controlling pattern is a linear pattern or a line and space pattern orthogonal to the second direction.

7. The interconnecting substrate described in any one of items 1 to 6, wherein the warpage-controlling pattern is made of the same material as the first interconnection pattern and has the same thickness as the first interconnection pattern.

8. The interconnecting substrate described in any one of items 1 to 7, wherein the warpage-controlling pattern comprises at least a pattern formed of a dummy interconnection provided in the sunken section in the bottom surface of the base insulating film.

9. The interconnecting substrate comprising substrate region units which correspond to the interconnecting substrates described in any one of items 1 to 8, wherein the substrate region units are formed so as to be arrayed in blocks.

10. The interconnecting substrate described in item 9, further comprising, in a peripheral part of an array region of the substrate region units, a block pattern provided in the sunken section in the bottom surface of the base insulating film.

11. The interconnecting substrate described in item 10, wherein the block pattern is made of the same material as the first interconnection pattern and has the same thickness as the first interconnection pattern.

12. The interconnecting substrate described in item 9, 10 or 11, comprising, as the warpage-controlling pattern, a first warpage-controlling pattern formed of a dummy interconnection provided within the substrate region unit and a second warpage-controlling pattern provided in a peripheral part of an array region of the substrate region units.

13. The interconnecting substrate described in item 12, wherein the second warpage-controlling pattern comprises a pattern in which region units comprising a line and space pattern orthogonal to the second direction are arrayed in blocks.

14. The interconnecting substrate described in any one of items 1 to 13, wherein a bottom surface of the first interconnection is flush with the bottom surface of the base insulating film.

15. The interconnecting substrate described in any one of items 1 to 13, wherein a bottom surface of the first interconnection is in a position above the bottom surface of the base insulating film.

16. The interconnecting substrate described in any one of items 1 to 15, wherein the base insulating film is made of a heat-resistant resin.

17. The interconnecting substrate described in any one of items 1 to 15, wherein the base insulating film is made of a fiber-reinforced resin composite material.

18. The interconnecting substrate described in any one of items 1 to 17, further comprising a solder resist layer which is formed in such a manner as to cover part of the second interconnection and cause a remaining part thereof to be exposed.

19. The interconnecting substrate described in any one of items 1 to 17, further comprising one or more interconnection structure layer which comprises an insulating layer provided on a top surface side of the base insulating film, a via hole formed in the insulating layer, and an upper layer interconnection which is connected to a lower interconnection via a conductor within the via hole and is formed on a top surface of the insulating layer.

20. The interconnecting substrate described in item 19, further comprising a solder resist layer which is formed in such a manner as to cover part of the upper layer interconnection and cause a remaining part thereof to be exposed.
21. A semiconductor device comprising the interconnecting substrate described in any one of items 1 to 20 and a semiconductor chip mounted on the interconnecting substrate.
22. The semiconductor device described in item 21, wherein the semiconductor chip is mounted on a bottom surface side of the interconnecting substrate and is connected to the first interconnection.

According to the present invention, it is possible to provide an interconnecting substrate which has sufficient mechanical strength but in which warpage is controlled. As a result, the transferability in the semiconductor chip-mounting step is improved and productivity can be improved. At the same time, a semiconductor device having high reliability can be provided.

DETAILED DESCRIPTION OF THE PREFERRED EMBODIMENTS

Figure 1:
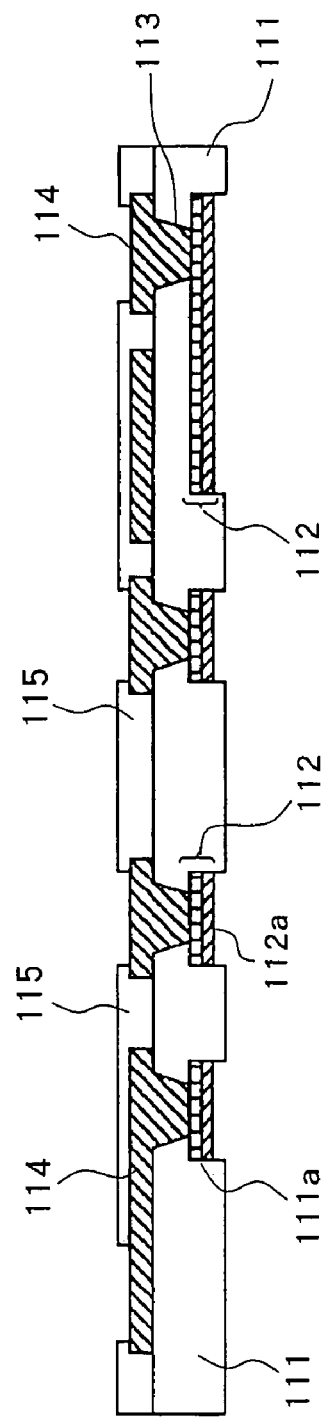
FIG. 1 is a sectional view of an embodiment of an interconnecting substrate according to the present invention.

Hereinafter, preferred embodiments of the present invention will be described.

Basic Structure of Interconnecting Substrate

First, a basic structure of an interconnecting substrate of the present invention will be described by using an embodiment shown in FIG. 1.

An interconnecting substrate of the present embodiment has base insulating film 111, lower layer interconnection 112 provided on a bottom surface side of this base insulating film, via hole 113 formed in the base insulating film, and upper layer interconnection 114 which is connected to the lower layer interconnection via a conductor within this via hole and is formed on a top surface of the base insulating film. Lower layer interconnection 112 is provided within sunken section 111a of a bottom surface of base insulating film 111. On base insulating film 111, solder resist layer 115 is formed in such a manner as to cause part of upper layer interconnection 114 to be exposed and cover a remaining part thereof, and the exposed portion can be used as a pad electrode. Solder resist layer 115 is provided as required and can be omitted.

Because lower layer interconnection 112 in an interconnecting substrate of the present invention is provided in such a manner as to bury sunken section 111a of the bottom surface of base insulating film 111, stresses and strains applied to the lower layer interconnection are reduced, accordingly stress concentration can be reduced and hence high connection reliability can be obtained. The width of this lower layer interconnection can be appropriately set in the range of, for example, 10 to 500 µm. This width can be set preferably in the range of 15 to 500 µm, more preferably in the range of 20 to 100 µm, and typically in the range of 20 to 40 µm.

From the standpoint of productivity and ease of handling, it is preferred that such an interconnecting substrate be provided in the form of a plate in which region units corresponding to target interconnecting substrates are formed so as to be arrayed in blocks within one substrate (hereinafter referred to as a block substrate). Also, from the standpoint of the workability during the mounting of semiconductor chips, it is preferred that all of these region units are arrayed in the same direction.

However, in such a block substrate, deformation of the substrate such as warpage and waviness is apt to occur when it does not have a structure according to the present invention. In particular, a warpage which is bent in such a manner that a valley is formed on the side where a lower layer interconnection is formed is apt to occur, and the occurrence of such a warpage remarkably reduces the transferability of a block substrate and the mounting accuracy of a chip in the step of mounting semiconductor chips. Concretely, when in order to mount a semiconductor chip on a surface of a block substrate on the side where a lower layer interconnection is formed, the substrate is placed with the side where a lower layer interconnection is formed facing upward, the substrate warps in such a manner that both sides thereof in the X-direction are raised in a case where there are many lower layer interconnections which are formed in the Y-direction in an X-Y orthogonal coordinate system.

It is believed that such a warpage of a block substrate is caused by the fact that the arrangement of lower layer interconnection 112 in sunken section 111a on the bottom surface side of base insulating film 111 is unevenly provided to the bottom surface side of the base insulating film. It is believed that stresses generated by the heat and pressure applied during the manufacturing process are unevenly distributed on the top surface side and bottom surface side within the base insulating film, generating strains, which cause a warpage in the substrate. Because the lower layer interconnection is provided in such a manner as to bury the sunken section in the bottom surface of the base insulating film, not only the top surface of the interconnection, but also the circumference of the side surface of the interconnection is in contact with the base insulating film, accordingly the area of contact with the insulating film is large, and hence strains increase over the whole base insulating film.

In the present invention, to prevent such a warpage of the substrate, there is provided a warpage-controlling pattern, which will be described later. This warpage-controlling pattern can be formed by a pattern provided in the sunken section of the bottom surface of the base insulating film (hereinafter, referred to as an in-sunken-section pattern). Concretely, this warpage-controlling pattern can be formed by a pattern of a dummy interconnection and, as required, by a support pattern provided in the peripheral part of the region in which the lower layer interconnection is formed. These patterns can be easily formed because patterning can be performed simultaneously with the lower layer interconnection.

In order to prevent the deformation of a substrate caused by a support body in conventional structures, in the present invention it is possible to provide a support pattern having a block pattern in the peripheral portion of a interconnecting substrate in place of the support body of conventional structures. Because patterning can be performed simultaneously with the lower layer interconnection, this support pattern can be formed with the same accuracy as in the formation of the interconnection without adding a complicated step. Because a support body of a conventional structure is formed on the whole surface of the peripheral edge region of an interconnecting substrate, strains due to a difference in the coefficient of thermal expansion between a material for the support body and a material for the base insulating film are apt to occur, causing deformation in the substrate. Because a support pattern according to the present invention has a block pattern formed of multiple support region units, it can efficiently suppress the deformation of the substrate such as waviness while reinforcing the substrate and increasing the shape-maintaining capability thereof. It is believed that this is because stresses due to a difference in the coefficient of thermal expansion are appropriately scattered by the block pattern. Each of the support region units, which constitute this support pattern, may be formed as a solid pattern. However, as will be described later, the support region units formed of a pattern having directionality such as a line and space pattern can function as a warpage-controlling pattern for suppressing the above-described warpage caused by the lower layer interconnection.

As shown in FIG. 1, in interconnection 112 provided within sunken section 111a of the bottom surface of base insulating film 111, the bottom surface of this interconnection is exposed, positioned above the bottom surface of the base insulating film and constitutes part of the bottom surface of the interconnecting substrate. That is, on the bottom surface of the base insulating film of the interconnecting substrate is formed the sunken section where the bottom surface of the lower layer interconnection constitutes the bottom surface of the sunken section. The depth of the sunken section where the bottom surface of the lower layer interconnection constitutes the bottom surface of the sunken section can be set at 0.5 to 10 μm or so, for example. With this sunken section, it is possible to prevent the deviation of the position of a bump or the displacement thereof, with the result that it is possible to increase position accuracy and reliability in the connection of a semiconductor chip having pads of narrow pitch. If the sunken section is too shallow, the above-described effect cannot be sufficiently obtained. If the sunken section is too deep, sufficient connection becomes difficult and in a case where underfill is to be provided, it becomes difficult to underfill.

Lower layer interconnection 112 may be made of a metal such as Cu, Ni, Au, Al, Pd and Ag, and the thickness of the lower layer interconnection can be set at 2 to 20 μm, for example. The lower layer interconnection may have a laminated structure. In FIG. 1, lower layer interconnection 112 has a two-layer structure having etching barrier layer 112a on the lower layer side. This etching barrier layer is made of Ni, Au or Pd, for example, and can prevent the etching of the lower layer interconnection in the etching removing step of a support board, which will be described later.

From the standpoint of required characteristics of the interconnecting substrate, and the strength, workability and preparation of a film material, and the like, the thickness of base insulating film 111 can be set at 3 to 100 μm, for example. If the thickness of the base insulating film is too small, it becomes impossible to obtain sufficient strength. If the thickness of the base insulating film is too large, the microfabrication workability of via holes decreases. Depending on desired characteristics such as heat resistance and mechanical strength, the material for the base insulating film can be selected from various resins and resin composite materials.

Via hole 113 is formed in the region immediately above sunken section 111a of base insulating film 111. According to the type of semiconductor package, the diameter of the via hole is set at 30 to 80 μm or so, for example. Within the via hole, a conductive material is buried so as to connect with the lower layer interconnection.

On the top surface of base insulating film 111 is formed upper layer interconnection 114 which conducts to the lower layer interconnection via the conductive material within the via hole. This upper layer interconnection can be formed integrally with the conductive material within the via hole, and the thickness of the upper layer interconnection can be set at 2 to 20 μm, for example. Also, on the top surface of base insulating film 111, solder resist 115 is formed in such a manner as to cause part of the upper layer interconnection to be exposed and cover a remaining part thereof, and the exposed part of the upper layer interconnection forms a pad electrode. The thickness of the solder resist layer can be set at 2 to 40 μm, for example.

Figure 2:
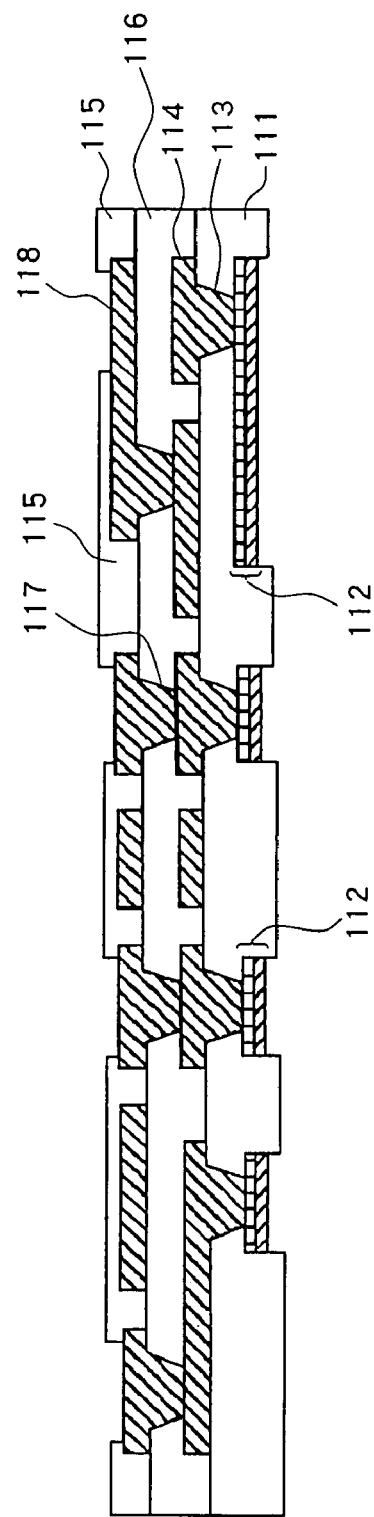
FIG. 2 is a sectional view of another embodiment of an interconnecting substrate according to the present invention.

As shown in FIG. 2, an interconnecting substrate of the present invention may have a multilayer structure in which on base insulating film 111 and upper layer interconnection 114 are formed interlayer insulating film 116, via hole 117 and second upper layer interconnection 118. Second upper layer interconnection 118, which can be formed in the same manner as above-described upper layer interconnection 114, conducts to upper layer interconnection 114 via a conductive material within via hole 117. On the top surface of interlayer insulating layer 116 is formed solder resist 115 in such a manner as to cause part of second upper layer interconnection 118 to be exposed and cover a remaining part thereof, and the exposed part of the second upper layer interconnection forms a pad electrode. The thickness of the solder resist layer can be set at 2 to 40 μm, for example.

In addition to the above-described multilayer interconnection structure, an interconnecting substrate of the present invention may have a multilayer interconnection structure comprising multiple layers of interlayer insulating film by further providing an interlayer insulating film, a via hole and an upper layer interconnection. The number of signals to be input to a semiconductor chip can be increased by forming the multilayer interconnection structure.

Figure 3:
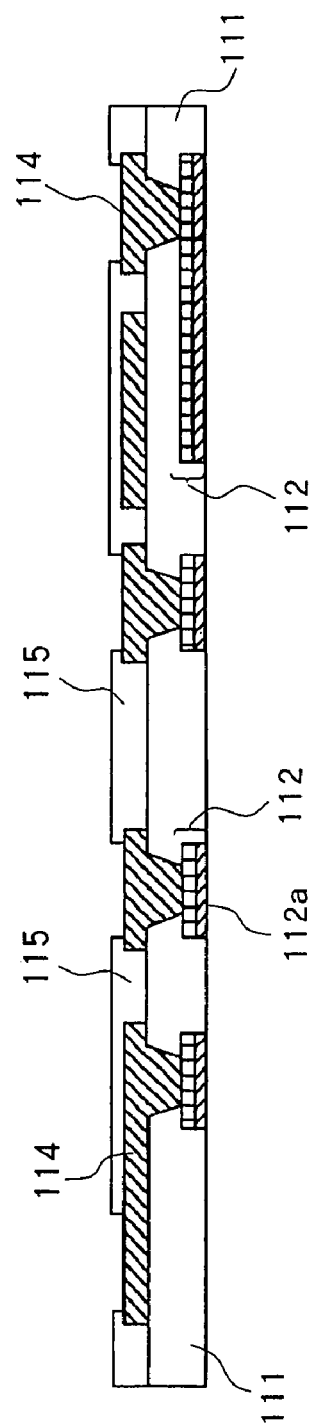
FIG. 3 is a sectional view of another embodiment of an interconnecting substrate according to the present invention.

As shown in FIG. 3, an interconnecting substrate of the present invention may have a structure in which the bottom surface of a lower layer interconnection is flush with the bottom surface of base insulating film 111. In this structure, when a semiconductor chip having pads of narrow pitch is mounted by use of bumps, it is possible to obtain a sufficient margin for the deviation of the position of bumps and connection reliability can be improved. Also, an interconnecting substrate of the present invention may have a structure in which the bottom end of the lower layer interconnection protrudes from the bottom surface of the base insulating film.

Warpage-Controlling Pattern and Support Pattern

It is believed that the warpage of an interconnecting substrate to be controlled by the present invention is caused, as described above, by the pattern of a lower layer interconnection provided in the sunken section of the bottom surface of a base insulating film (hereinafter, referred to as the lower layer interconnection pattern). Such a warpage of an interconnecting substrate is apt to occur in a case where the lower layer interconnection forms a pattern in which one coordinate component in an X-Y orthogonal coordinate system is larger than the other. That is, in an X-components and a Y-component of the pattern, when the ratio of the Y-component to the X-component (Y/X) (hereinafter, referred to as the pattern component ratio (Y/X)) is larger than 1, a warpage tends to occur in the interconnecting substrate.

Figure 11:
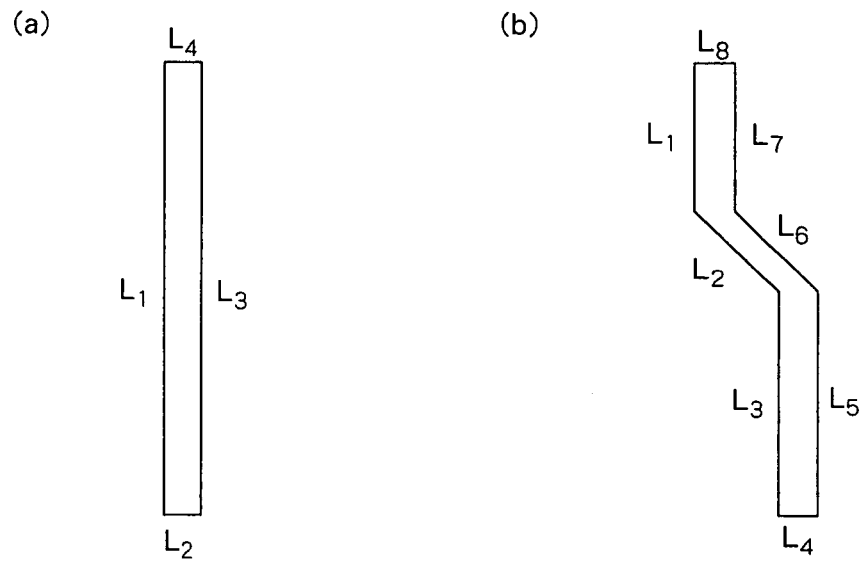
FIGS. 11 (a) and 11 (b) are plan views to explain an X-component and a Y-component of a pattern in the present invention.

The X-component and Y-component of a pattern of the present invention respectively indicate an X-component and Y-component of a pattern profile line in an X-Y orthogonal coordinate system. This pattern profile line corresponds to a tangent line between a pattern member (for example, the lower layer interconnection) within the sunken section and the base insulating film. For example, in the pattern shown in FIG. 11(a), L1 to L4 indicate a profile line, and in the pattern shown in FIG. 11(b), L1 to L8 indicate a profile line. The above-described pattern component ratio (Y/X) indicates the ratio of the sum total of the Y-component (absolute value) of a profile line of a prescribed pattern to the sum total of the X-component (absolute value) thereof.

In an interconnecting substrate, the larger the pattern component ratio (Y/X) of the lower layer interconnection, for example, the pattern component ratio (Y/X) being not less than 55/45, further not less than 60/40, and particularly not less than 70/30, more readily a warpage is apt to occur and also the greater the degree of formation of a warpage. Accordingly, the present invention can produce a sufficient effect in a case where this pattern component ratio (Y/X) is larger than 1, typically in a case where it is not less than 55/45, further in a case where it is not less than 60/40, and particularly in a case where it is not less than 70/30. The upper limit of this pattern component ratio (Y/X) may be set at not more than 85/15, for example. If this ratio is too high, it becomes difficult to form an interconnection pattern for making a desired circuit.

Figure 12:
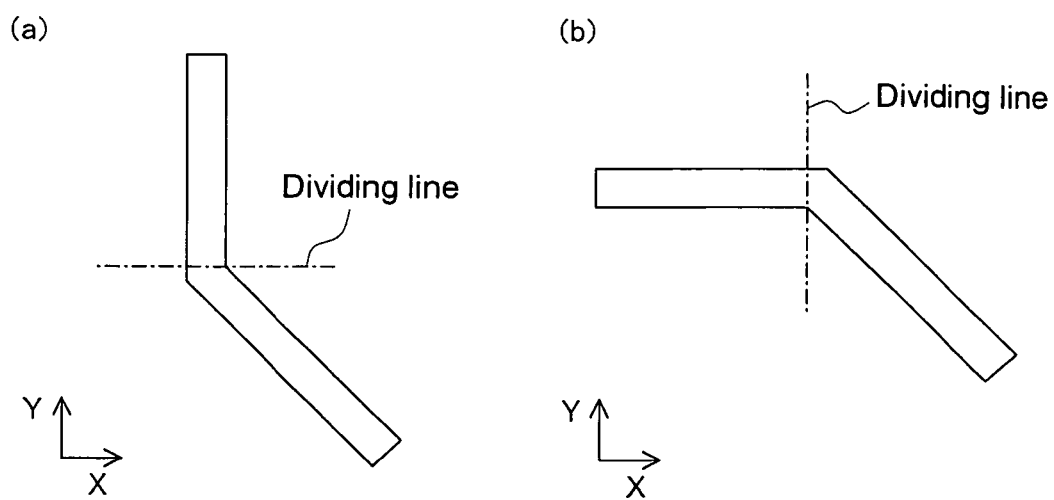
FIGS. 12(a) and 12(b) are plan views to explain a boundary of a pattern in the present invention.

The present invention is effective for an interconnecting substrate where, in a lower layer interconnection pattern, the area ratio of the total of a linear pattern extending along the X-direction and a linear pattern extending along the Y-direction is not less than 60%, based on the whole area of the lower layer interconnection pattern, further not less than 70% and particularly not less than 80%. The area ratio is a ratio based on the area occupied by a pattern itself on a plane surface of a substrate. That is, the above-described area ratio of a linear pattern means, in a plane surface of a substrate, the ratio of occupied area of a total of a linear pattern extending along the X-direction and a linear pattern extending along the Y-direction to the whole occupied area of the lower layer interconnection pattern. When a linear pattern extending along the X-direction or the Y-direction and another pattern are continuous, the boundary between the two patterns is a dividing line in the width direction of the linear pattern concerned, which is either of the dividing lines along the X-direction and the Y-direction. FIGS. 12(a) and 12(b) show dividing lines when a linear pattern extending in the X-direction or the Y-direction and a slant pattern are continuous.

In the present invention, a warpage-controlling pattern is provided in order to suppress a warpage of an interconnecting substrate due to uneven coordinate components of a lower layer interconnection pattern as described above. A warpage-controlling pattern according to the present invention is provided in the sunken section of the bottom surface of the base insulating film and it is preferred that the pattern component ratio (Y/X) be smaller than 1. From the standpoint of efficiently suppressing a warpage, this pattern component ratio (Y/X) is preferably not more than 30/70, and more preferably not more than 20/80. Particularly, from the standpoint of excellence in warpage controllability and easy pattern formation, it is preferred that the warpage-controlling pattern be formed of a linear pattern intersecting with the Y-direction, and typically, a linear pattern or a line and space pattern (the Y-component is zero) orthogonal to the Y-direction can be used. Because a line and space pattern has a great effect on the suppression of a warpage, it is possible to make its occupation ratio relatively small and hence the line and space pattern is advantageous also from the standpoint of the high density design of a lower layer interconnection.

In an interconnecting substrate of the present invention, the pattern component ratio (Y/X) of a pattern within the sunken section, particularly the pattern component ratio (Y/X) of a pattern that comprises the warpage-controlling pattern and the lower layer interconnection pattern are brought together is preferably within the range of 70/30 to 30/70, more preferably in the range of 65/35 to 35/65, still more preferably in the range of 60/40 to 40/60, and most preferably in the range of 55/45 to 45/55. If this pattern component ratio (Y/X) is too high, it is impossible to obtain a sufficient warpage-controlling effect. Conversely, if this pattern component ratio (Y/X) is too low, there is a possibility that the occurrence of a warpage due to a warpage-controlling pattern may be caused.

According to a warpage-controlling pattern of the present invention, stresses due to uneven coordinate components of a lower layer interconnection pattern can be weakened by being canceled out, a warpage of the interconnecting substrate can be suppressed. Also, it is believed that because the warpage-controlling pattern is provided on the bottom surface side of the base insulating film as in the same manner as the lower layer interconnection that causes a warpage, the effect of the warpage-controlling pattern on the canceling out stresses is high. Because a warpage of the interconnecting substrate is suppressed, the transferability of the interconnecting substrate in the step of mounting a semiconductor chip is improved and the throughput can be improved. Furthermore, mounting accuracy can be improved in the mounting step of a semiconductor chip, with the result that yield and connection reliability can be improved.

The area occupation rate of the lower layer interconnection in an interconnecting substrate of the present invention is preferably in the range of 5% to 70%, more preferably in the range of 10% to 60%, and most preferably in the range of 15% to 45%. If this area occupation rate is too low, it becomes impossible to obtain a desired high density interconnection. If this area occupation rate is too high, it becomes difficult to ensure insulation between interconnections from the standpoint of working accuracy. In an interconnecting substrate of the present invention, a warpage becomes apt to occur when the lower layer interconnection of the interconnecting substrate has such an area occupation rate, and the present invention can sufficiently exhibit the effect of a warpage-controlling pattern against such a warpage.

The area occupation rate refers to the percentage of the area occupied by the lower layer interconnection to the area of the region where the lower layer interconnection is formed, in one component unit in a plane surface of the interconnecting substrate. The region where the lower layer interconnection is formed refers to the area within a quadrangle of minimum area which encloses the lower layer interconnection. The component unit refers to a unit of the interconnecting substrate or the substrate region corresponding to this interconnecting substrate that is used in a target semiconductor package on which one prescribed semiconductor chip or one set of such semiconductor chips are mounted.

In a block substrate in which region units corresponding to a target interconnecting substrate (the above-described component units) are formed so as to be arrayed in blocks on one substrate, the area occupation rate of a pattern within the sunken section (including the lower layer interconnection, the warpage-controlling pattern and the support body pattern) is preferably in the range of 10% to 70%, more preferably in the range of 20% to 60%, and most preferably in the range of 25% to 50%. The area occupation rate in this case refers to the percentage of the area occupied by the pattern within the sunken section to the area of the whole plane surface of the block substrate. If this area occupation rate is too low, it becomes impossible to obtain a desired high density interconnection and at the same time, sufficient warpage control becomes difficult. If this area occupation rate is too high, from the standpoint of working accuracy, it becomes difficult to ensure insulation between interconnections and at the same time, deformation such as waviness of the interconnecting substrate becomes apt to occur.

The above-described warpage-controlling pattern can be formed by an in-sunken section pattern provided in the sunken section of the bottom surface of the base insulating film. In this in-sunken section pattern, a pattern of a dummy interconnection provided in the region where the lower layer interconnection is formed can be used as the warpage-controlling pattern. Furthermore, if necessary, in the in-sunken section pattern, a support pattern provided in peripheral part of the region where the lower layer interconnection is formed can be used as the warpage-controlling pattern.

The warpage-controlling pattern of a dummy interconnection (the first warpage-controlling pattern) can be provided in an open space within the region where the lower layer interconnection is formed. By forming the warpage-controlling pattern in this open space, a warpage of the whole interconnecting substrate can be suppressed and at the same time, a uniform interconnection distribution can be ensured. As a result, the formation of a high accuracy lower layer interconnection becomes possible and it is possible to suppress the deformation such as waviness of the plane surface of the substrate. For the first warpage-controlling pattern, patterning can be performed simultaneously with the lower interconnection, and the material and thickness of the first warpage-controlling pattern can be set in the same manner as with the material and thickness of the lower layer interconnection. The width, length and shape of the first warpage-controlling pattern can be set according to the pattern of the lower layer interconnection.

On the other hand, the warpage-controlling pattern of a support pattern (the second warpage-controlling pattern) can be provided in the peripheral part of the region where the lower layer interconnection is formed. From the standpoint of an improvement in interconnection density, in a case where the region where the first warpage-controlling pattern is provided cannot be sufficiently ensured, effective warpage-control can be performed by providing the second warpage-controlling pattern of a support pattern. Because the second warpage-controlling pattern is provided in the peripheral part of the region where the lower layer interconnection is formed, it is possible to sufficiently ensure the formation region without the restrictions of the interconnection density of the lower layer interconnection. For the second warpage-controlling pattern, patterning can be performed simultaneously with the lower layer interconnection, and the material and thickness of the second warpage-controlling pattern can be set in the same manner as with the material and thickness of the lower layer interconnection. The width, length and shape of the second warpage-controlling pattern can be set according to the pattern of the lower layer interconnection and the first warpage-controlling pattern. For the second warpage-controlling pattern, the pattern density can be appropriately set according to the pattern density of the lower layer interconnection pattern within the component unit (product part) of the substrate, and effective warpage control can be performed by providing a pattern region having a pattern density which is at least at the same level as the interconnection density of the lower layer interconnection pattern.

Figure 4:
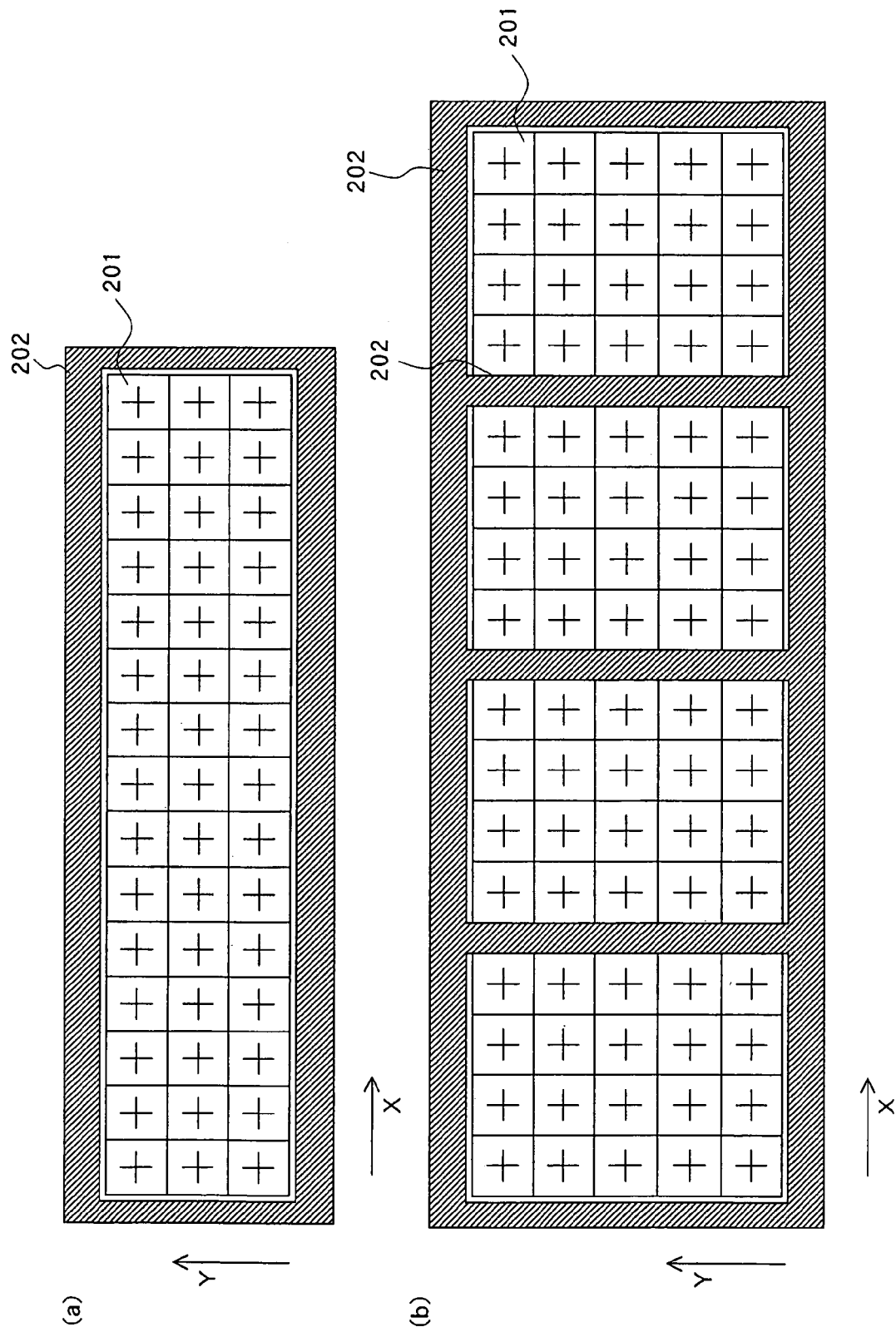
FIGS. 4(a) to 4(d) are plan views of another embodiment of an interconnecting substrate according to the present invention.
Figure 4C:
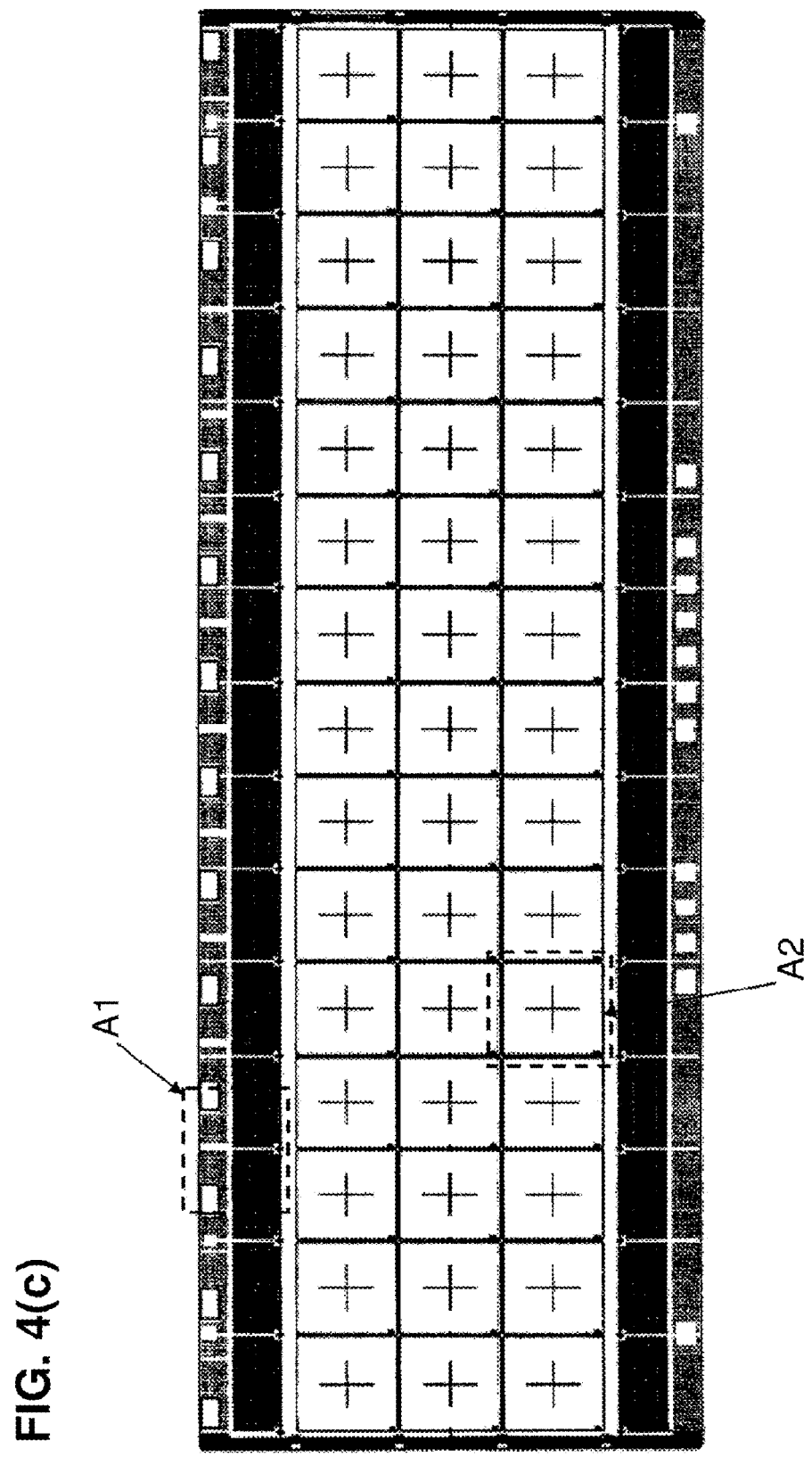
Figure 4D:
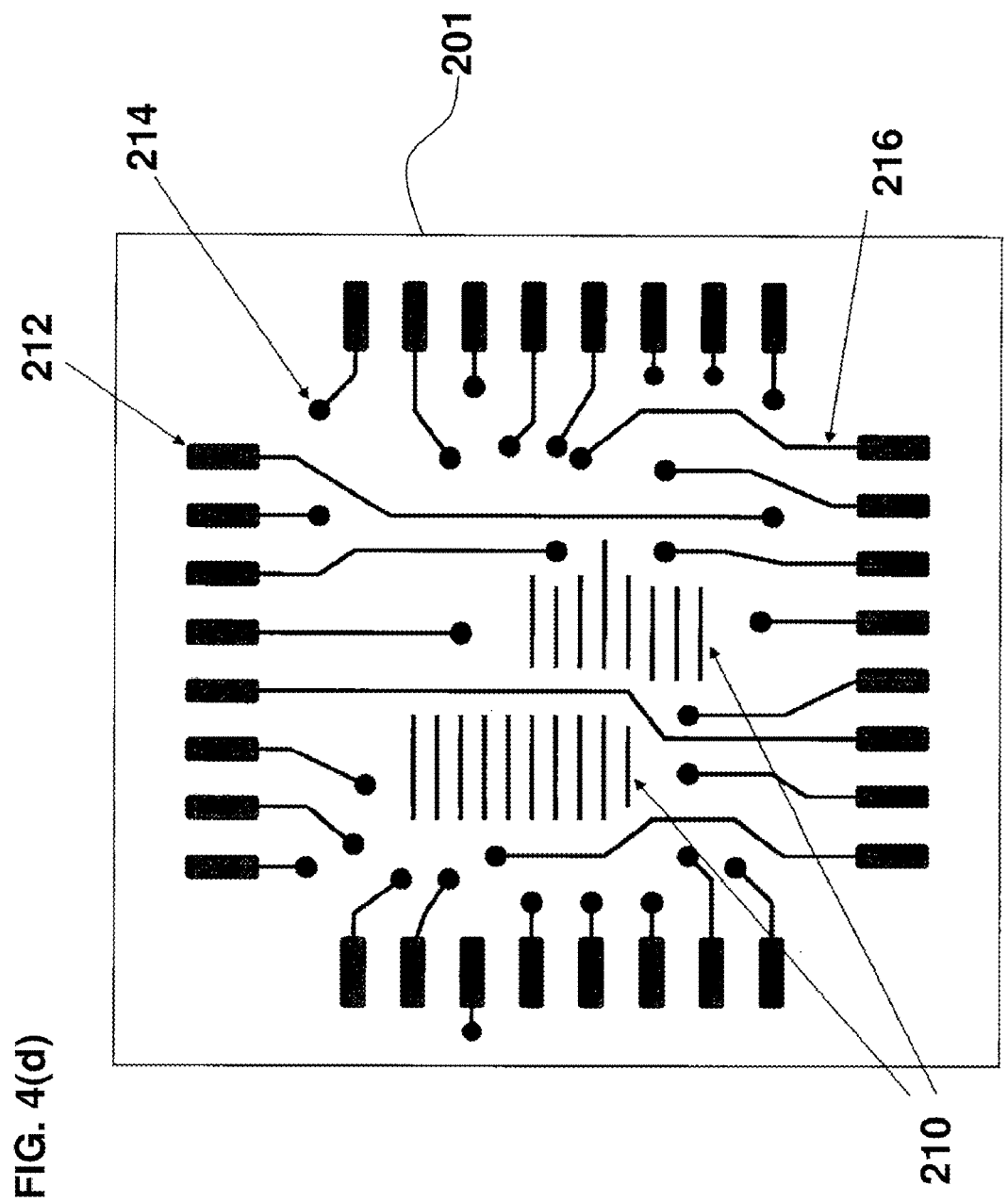
Figure 5:
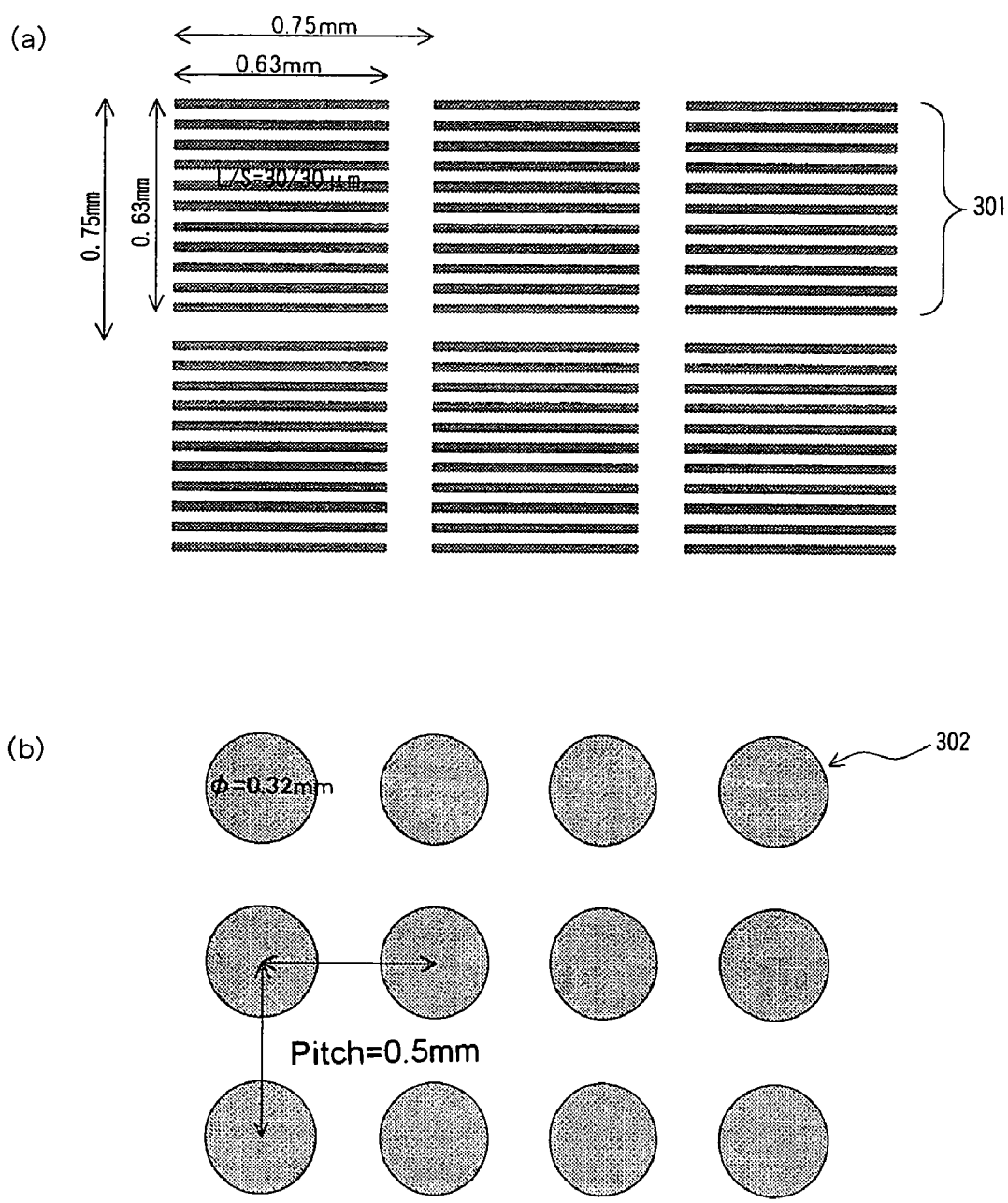
FIGS. 5(a) to 5(c) are partially enlarged views of another embodiment of an interconnecting substrate according to the present invention.
Figure 5C:
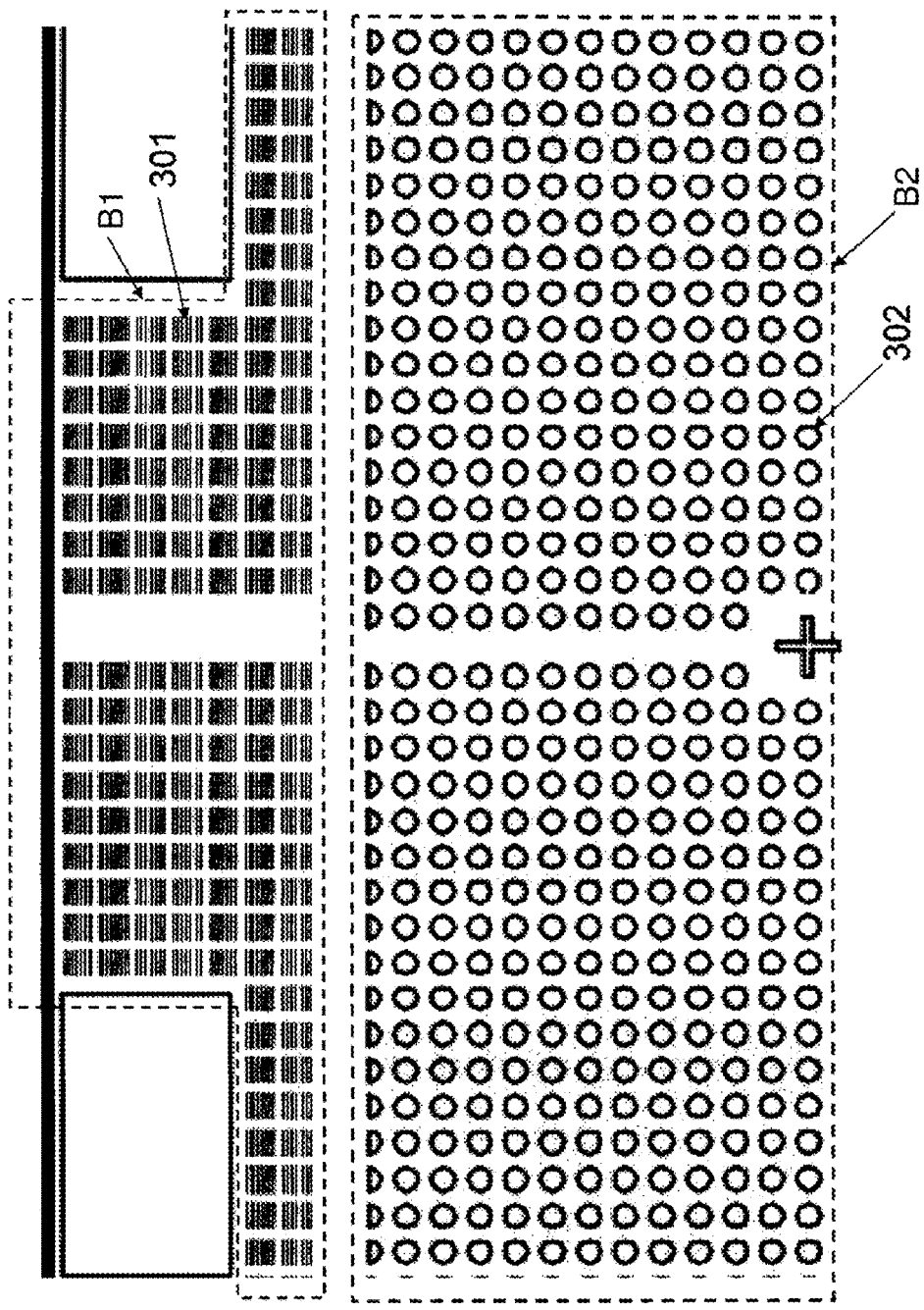

FIGS. 4(a) to 4(d) show plan views of an embodiment of an interconnecting substrate (block substrate) according to the present invention, and FIGS. 5(a) to 5(c) show a support pattern provided in peripheral region 202 of an interconnecting substrate.

In this embodiment, as shown in FIGS. 4(a), and 4 (c), component units 201 (product parts) of the interconnecting substrate are arrayed in blocks A2, and a support pattern A1 is formed in peripheral region 202 which encloses the circumference of the block array of the component units 201. This support pattern A1 has the warpage-controlling pattern. The component unit 201 of the interconnecting substrate refers to the unit of a substrate region corresponding to an interconnecting substrate which is used in a target semiconductor package on which one prescribed semiconductor chip or one set of such semiconductor chips are mounted. The component unit 201, as shown in FIG. 4(d), includes dummy interconnections 210, which serve as the warpage-controlling pattern, and bonding pads 212 electrically interconnected to vias 214 by way of interconnections 216. By thus providing multiple component units corresponding to target interconnecting substrates in one substrate, the handling during the transfer of an interconnecting substrate becomes easy and at the same time, the productivity of a semiconductor package can be improved.

The support pattern A1 provided in the peripheral region 202 has the role of a reinforcing body which keeps the shape of the interconnecting substrate (block substrate) and can also be used as a gripping margin during transferring and a nipping allowance during sealing. As shown in FIG. 4(c), the support pattern A1 can be formed in the region at the peripheral edge of the block substrate. Furthermore, as shown in FIG. 4(b), the support pattern A1 can also be formed in the lattice-shaped region. As described above, if the support pattern A1 is formed on the whole surface of the formation region, i.e., as what is called a solid pattern, then deformation is apt to occur in the substrate. Therefore, it is preferred that the support pattern A1 be formed as a block pattern comprising multiple pattern units (support region units), as shown by regions B1 and B2 in FIG. 5(c). As this block pattern, each pattern unit in region B2 can be formed as a solid pattern 302 which is a circle, a polygon, etc., as shown in FIGS. 5(b) and 5(c). Also, it is possible that, as shown in FIGS. 5(a) and 5(c), each pattern unit 301 is an assembly of small pattern units in region B1. The latter form illustrated in FIGS. 5(a) and 5(c) can be used as the warpage-controlling pattern..

As a concrete example of the block substrate, for the block substrate shown in FIG. 4(a), it is possible to set the profile size of the block substrate at 190 mm×65 mm, for example, and the profile size of the substrate component unit 201 at 12 mm×13 mm, for example. In peripheral region 202 of the substrate, the warpage-controlling pattern shown in FIG. 5(a), i.e., a pattern in which pattern units 301 comprising line and space patterns (line width: 30 µm, space width: 30 µm) are arrayed in blocks is formed in such a manner as to enclose substrate component units 201 that are arrayed in blocks. The line and space patterns have the function of suppressing a warpage of the interconnecting substrate caused by the lower layer interconnection, and the block array of pattern units 301 has the function of preventing deformation of the plane surface of the substrate resulting from the support pattern. In this embodiment, it is possible that the block patterns shown in FIG. 5(b) are further disposed inside the block patterns shown in FIG. 5(a) in such a manner as to enclose substrate component units 201 that are arrayed in blocks. The occupation rate and layout of these two kinds of block patterns can be set according to desired effects.

In this embodiment, line and space patterns as the warpage-controlling pattern are provided and at the same time, the whole support pattern is constituted by an assembly of multiple pattern units, i.e., a block pattern. If a support body of solid pattern is formed on the whole surface of the peripheral edge region of the interconnecting substrate, the deformation of the plane surface of the substrate becomes apt to occur. However, the deformation of a plane surface of the substrate can be suppressed by adopting such a block pattern. It is believed that stresses are released by an area where the support pattern is not provided between pattern units.

A warpage of the interconnecting substrate poses a great problem in the substrate transfer step during the manufacturing of a semiconductor package. Particularly in a case where a rectangular block substrate having multiple component units 201 of the interconnecting substrate is transferred in the longitudinal direction (in the X-direction in the figure), with the lower interconnection side facing upward, if the block substrate are warped in such that both sides of the longitudinal direction thereof rise, the transfer of the substrate becomes very difficult with a transfer method which uses an existing transfer device. In a case where such a warpage occurs, the lower layer interconnection is formed much in the Y-direction, that is, the Y-component of the lower layer interconnection pattern is larger than the X-component thereof (Y/X>1). In such a block substrate, by forming the warpage-controlling pattern much in the X-direction, that is, by making the X-component of the warpage-controlling pattern larger than the Y-component thereof (Y/X<1), a warpage of the interconnecting substrate can be suppressed by canceling out stresses resulting from the lower layer interconnection with stresses by the warpage-controlling pattern. As a result of this, the transfer of the interconnecting substrate can be performed easily and with good accuracy, the productivity of a semiconductor package can be improved, and the reliability of a product can be improved.

Base Insulating Film

Hereinafter, preferable resin materials as the base insulating film in the present invention will be described.

The material for the base insulating film in the present invention can be selected from various kinds of resin materials according to desired characteristics such as heat resistance and mechanical strength. For example, from the standpoint of mechanical strength and heat resistance, it is possible to use a composite resin material in which a reinforcing material is contained in a heat resistant resin, preferably a fiber-reinforced resin composite material. A reinforcing fiber made of glass or aramid can be favorably used as the reinforcing material, and it is possible to use a resin having a glass transition temperature which is not less than a prescribed temperature, preferably not less than 150° C. as the heat resistant resin. The glass transition temperature is in accordance with JIS C6481 and can be measured by the DMA (Dynamic Mechanical Analysis) method. Epoxy resins, polyimide resins, cyanate resins and liquid crystal polymers can be enumerated as this heat resistant resin. From the standpoint of the manufacture of a composite resin, epoxy resins can be favorably used when the impregnatability to a reinforcing fiber is considered. From the standpoint of forming fine via holes satisfactorily by a method using a laser etc., it is preferred that the diameter of a reinforcing fiber be not more than 10 µm.

By controlling physical properties in consideration of the coefficient of thermal expansion in the thickness direction, modulus of elasticity, and fracture strength of the base insulating film made of a resin material as described above and the temperature dependence of these characteristics, it is possible to improve reliability by preventing the occurrence of cracks due to repeated thermal loads and thermal deterioration, such as open faults in connections. For example, it is possible to provide an interconnecting substrate having excellent mechanical properties and heat resistance by setting the film thickness at 20 to 100 µm and adopting the following conditions. Incidentally, the modulus of elasticity and fracture strength of an insulating film can be measured by conducting a tension test in accordance with "JPCA Standard, Build-up Interconnection Substrate JPCA-BU01, Section 4.2" for 1-cm wide rectangle test pieces.

(1) Coefficient of thermal expansion in the thickness direction: Not more than 90 ppm/K, If the modulus of elasticity when the temperature is t° C. is denoted by Dt and the fracture strength when the temperature is t° C. is denoted by Ht, (2) $D23 \geqq 5$ GPa, (3) $D150 \geqq 2.5$ GPa (4) $D\text{-}65/D150 \leqq 3.0$ (5) $H23 \geqq 140$ MPa (6) $H\text{-}65/H150 \leqq 2.3$.

By satisfying the condition (1), strain stresses in the thickness direction due to repeated thermal stresses can be reduced and hence open faults in connections can be prevented. By satisfying the condition (2), it is possible to sufficiently ensure the transferability of an interconnecting substrate during the assembly of a semiconductor package. By satisfying the condition (3), a sufficient wire bonding capability can be ensured. Because $D150 \geqq 2.5$ GPa is satisfied and the glass transition temperature of a heat resistant resin is not less than 150° C., a good wire bonding capability is obtained. By satisfying the condition (4), because of a small change in the modulus of elasticity due to temperature difference, it is possible to reduce strain stresses due to a repetition of the heating and cooling steps and hence suppress a warpage of a semiconductor package. By satisfying the condition (5), a breakage of a base insulating film can be suppressed and hence it is possible sufficiently ensure the handlability and transferability of an interconnecting substrate during the assembly of a semiconductor package. By satisfying the condition (6), because of a small change in fracture strength due to temperature difference, it is possible to sufficiently ensure the durability of a base insulating film in the high-temperature processing step such as wire bonding.

In addition to the above-described resin materials, it is possible to use resin materials as disclosed in the JP2004-179647A. That is, from the standpoint of obtaining a semiconductor package excellent in reliability by suppressing the occurrence of cracks due to repeatedly applied thermal stresses, it is possible to use a resin material having a film thickness of 3 to 100 µm, a fracture strength at 23° C. of not less than 80 MPa and a value of the ratio (a/b) which is not more than 4.5 when the fracture strength at −65° C. is "a" and the fracture strength at 150° C. is "b". In addition to these conditions, a resin material having a modulus of elasticity at 150° C. of not less than 2.3 GPa can be favorably used. Also, in addition to these conditions, a resin material having a value of the ratio (c/d) of not more than 4.7 can be favorably used when the modulus of elasticity at −65° C. is "c" and the modulus of elasticity at 150° C. is "d", and furthermore, it is possible to favorably use a resin material in which the value of the ratio (a/b) is not more than 2.5, or the value of the ratio (a/b) is more than 2.5 but not more than 4.5 and the absolute value of a difference between the ratio (a/b) and the ratio (c/d) is not more than 0.8. The above-described fiber-reinforced resin composite materials or heat resistant resins themselves can be used as such resin materials.

Structure of Semiconductor Device

Next, the structure of a semiconductor device will be described.

Figure 6:
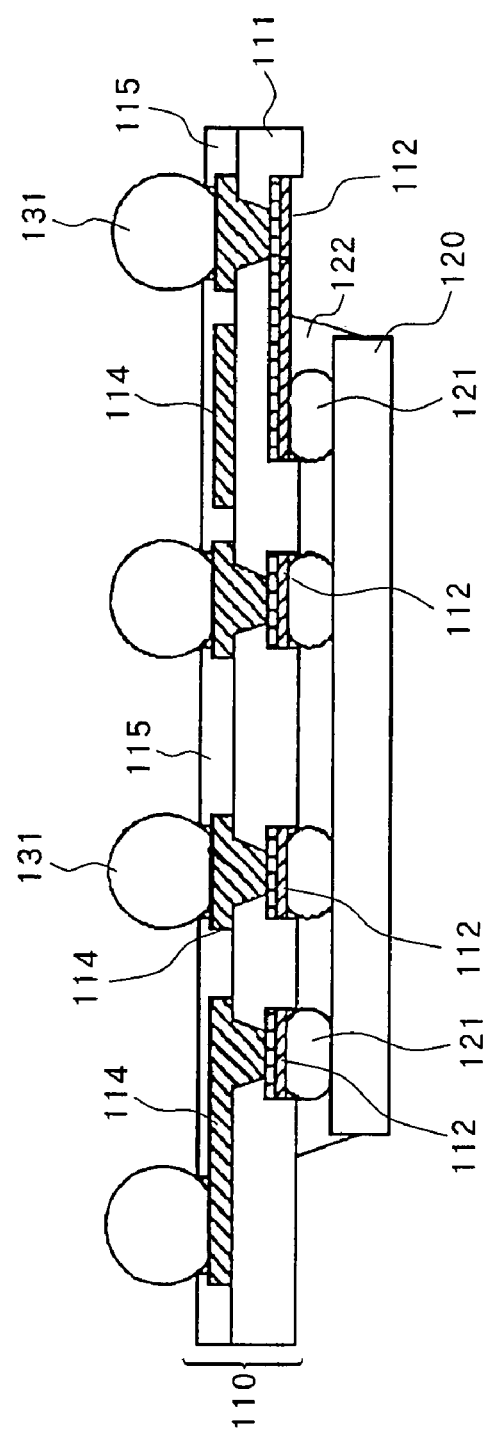
FIG. 6 is a sectional view of an embodiment of a semiconductor device according to the present invention.

FIG. 6 shows an example of a semiconductor device. In this embodiment, bump 121 is connected to lower layer interconnection 112 of interconnecting substrate 110, and semiconductor chip 120 electrically connected to this bump is provided on the bottom surface side of the interconnecting substrate. A silicon chip on which an integrated circuit such as an LSI is formed can be used as the semiconductor chip. Underfill 122 is formed between the semiconductor chip and the interconnecting substrate. On the other hand, solder ball 131 is provided in the exposed part of upper layer interconnection 114 of interconnecting substrate 110, i.e., in part of the pad electrode. This solder ball is electrically connected to an electrode of semiconductor chip 120 via upper layer interconnection 114, a conductor within a via hole, lower layer interconnection 112 and bump 121. A semiconductor package having this structure is mounted on an external board (not shown) via solder ball 131.

In the above-described structure, molding is conducted as required and may be omitted. When the protection and reinforcement of the semiconductor chip are required, it is possible to coat the semiconductor chip with a mold resin in such a manner as to cover the semiconductor chip. Although in this embodiment the semiconductor chip is mounted on the interconnecting substrate via the bump and mounted on the board via the solder ball, it is also possible to provide these connections by the wire bonding method and the tape bonding method.

Figure 7:
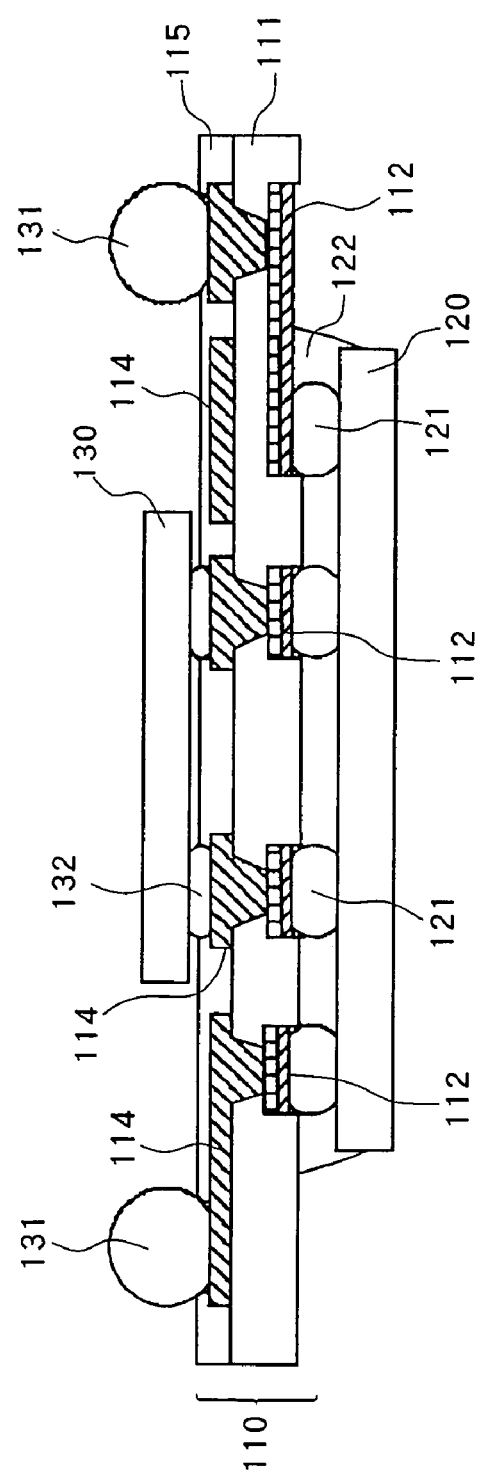
FIG. 7 is a sectional view of another embodiment of a semiconductor device according to the present invention.

FIG. 7 shows another embodiment of a semiconductor device of the present invention. In this embodiment, semiconductor chip 130 is mounted also on the top surface of an interconnecting substrate 110 and other constructions are the same as in the above-described example. This semiconductor chip 130 is connected to upper layer interconnection 114 via bump 132. That is, an electrode of semiconductor chip 130 on the top surface side of the interconnecting substrate is electrically connected to an electrode of semiconductor chip 120 on the bottom surface side via bump 132, upper layer interconnection 114, a conductor within the via hole, lower layer interconnection 112 and bump 121. And a semiconductor package having this structure is mounted on an external board (not shown) via solder ball 131. In this embodiment, two semiconductor chips can be mounted on one interconnecting substrate.

In the above-described embodiment, mounting is performed, with the surface of the interconnecting substrate on the upper layer interconnection side facing the mounting surface of the external board. However, it is also possible to perform mounting, with the surface of the interconnecting substrate on the lower layer interconnection side facing the mounting surface of the external board. Also for an interconnecting substrate having the multilayer interconnection structure described with reference to FIG. 2, in the same manner as in the above-described embodiment, it is possible that the semiconductor chip is mounted and that the package is mounted on the board. The connection when the semiconductor chip is mounted on the interconnecting substrate and the connection when the interconnecting substrate on which the semiconductor chip is mounted is mounted on the board can also be provided by the wire bonding method and the tape bonding method.

Method of Manufacturing Interconnecting Substrate

Hereinafter, a method of manufacturing an interconnecting substrate will be described. FIGS. 8(a) to 8(e) are sectional views of a manufacturing process of the interconnecting substrate shown in FIG. 1.

Figure 8:
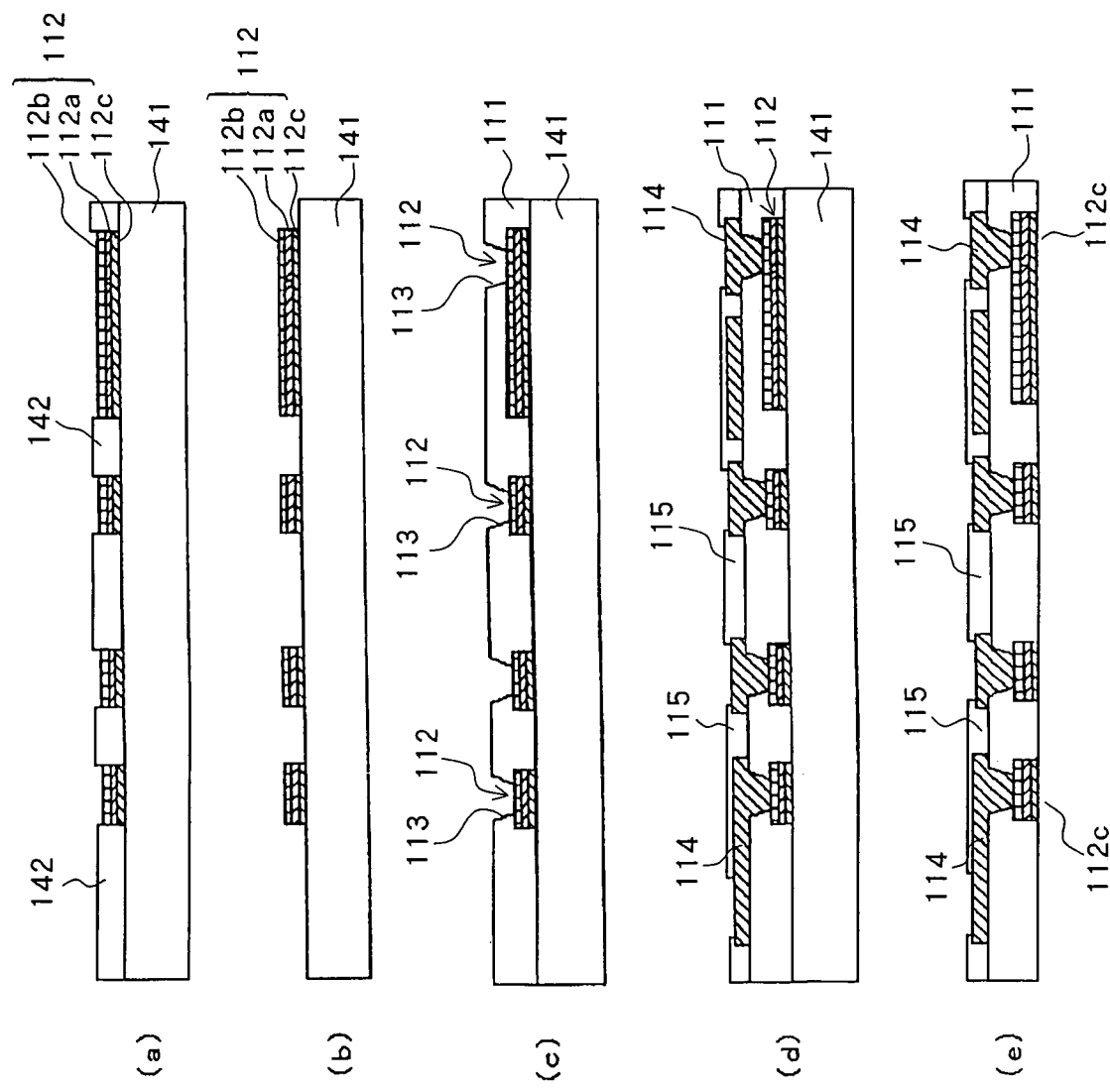
FIGS. 8(a) to 8(e) are sectional views of a manufacturing process of an interconnecting substrate according to the present invention.
Figure 9:
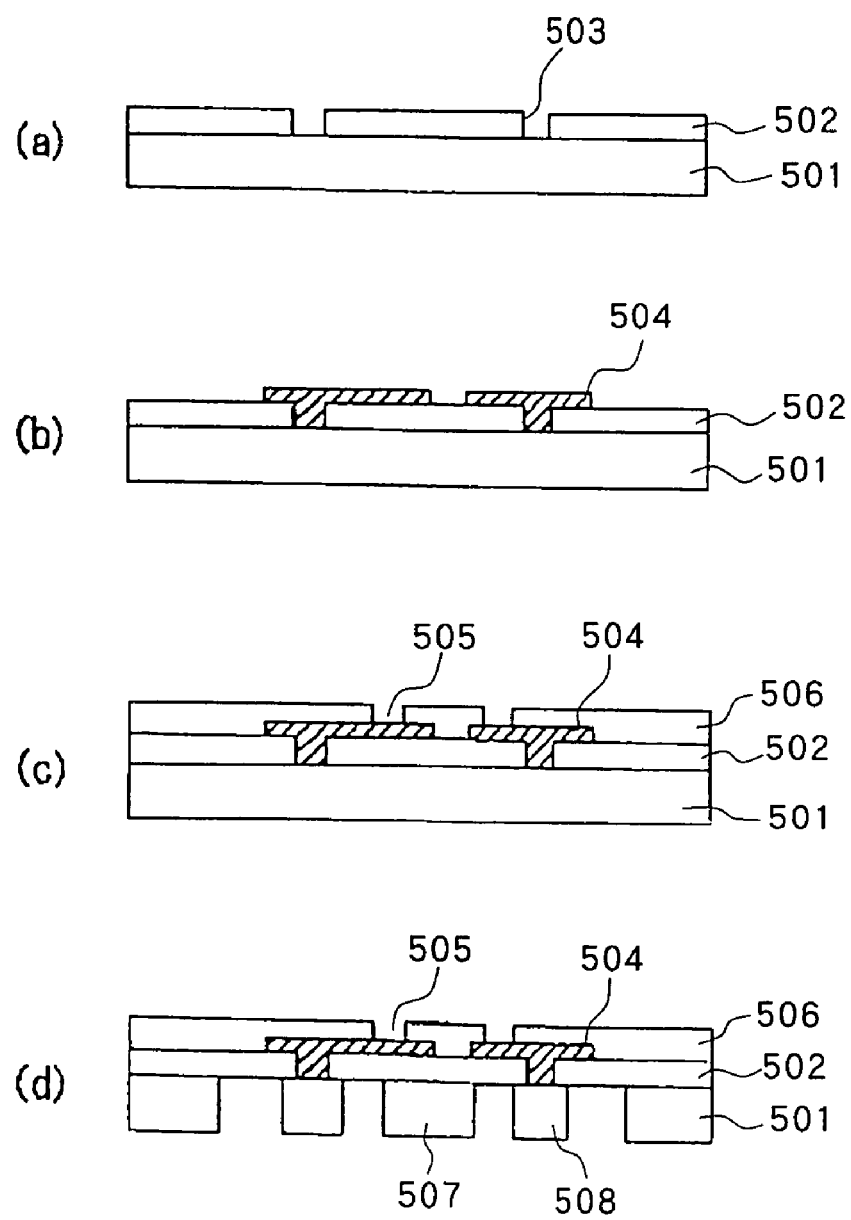
FIGS. 9(a) to 9(d) are explanatory diagrams of a conventional interconnecting substrate.
Figure 10:
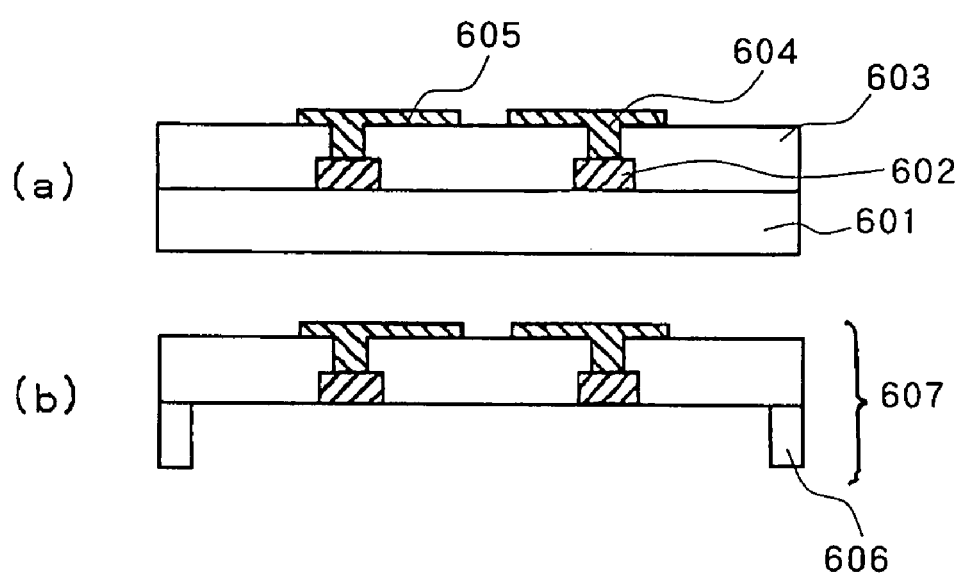
FIGS. 10(a) and 10(b) are explanatory diagrams of a basic structure of an interconnecting substrate.

First, as shown in FIG. 8(a), support board 141 made of metal such as a stainless steel, Cu and a Cu alloy is prepared, and on this support board is formed resist layer 142 having an opening pattern corresponding to a lower layer pattern, a warpage-controlling pattern and a support pattern. In this opening pattern, by the plating method, for example, high etching rate layer 112c, etching barrier layer 112a and pattern main-body layer 112b are formed in this order. For example, a single Cu layer, a single Ni layer, and a two-layer plating layer constituted by a Cu layer and a Ni layer can be used as high etching rate layer 112c, and the thickness of this high etching rate layer can be set at 0.5 to 10 μm, for example. For example, a plating layer made of Ni, Au, Pd, etc. can be used as etching barrier layer 112a, and the thickness of this etching barrier layer can be set at 0.1 to 7 μm, for example. For example, a plating layer made of Cu, Ni, Au, Al, Pd, etc. can be used as pattern main-body layer 112b and the thickness of this pattern main-body layer can be set at 2 to 20 μm, for example. Materials for the high etching rate layer and the etching barrier layer can be appropriately selected in consideration of the etching rate for a material for the support board. As preferred examples of material combinations, a Au plating layer can be used as the etching barrier layer for a support board made of a stainless steel, and a Ni plating layer can be used as the etching barrier layer for a support board made of copper or a copper alloy. The Ni plating layer has the function of preventing the diffusion of a solder at high temperatures. For this reason, in order to prevent the diffusion of a solder in the mounting step of a semiconductor chip and the mounting step of a semiconductor package, the Ni layer can be provided between pattern main-body layer 112b and etching barrier layer 112a.

Next, after the removal of resist layer 142 as shown in FIG. 8(b), base insulating film 111 is formed on support board 141 in such a manner as to cover lower layer interconnection 112, a warpage-controlling pattern (not shown) and a support pattern (not shown). This base insulating film 111 can be formed, for example, by sticking an insulating resin film onto the support board, pressing and curing, for example, at 100 to 400° C. for 10 minutes to 2 hours. After that, via hole 113 is formed in base insulating film 111 in the region immediately above lower layer interconnection 112 by the laser processing method, for example.

Next, as shown in FIG. 8(d), a conductive material is buried within via hole 113 and upper layer interconnection 114 is formed on base insulating film 111. The conductive material within via hole 113 and upper layer interconnection 114 can be formed, for example, by forming a plating layer made of Cu, Ni, Au, Al, Pd and so on, and patterning this plating layer.

The thickness thereof can be set at 2 to 20 μm, for example. Next, solder resist layer 115 having a thickness of 5 to 40 μm or so is formed in such a manner as to cover part of upper layer interconnection 114 and cause a remaining part thereof to be exposed. This solder resist layer can be omitted. Without forming this solder resist layer, the above-described multilayer interconnection structure can be formed on the support board by forming an interlayer insulating film on the base insulating film so as to cover the whole of upper layer interconnection 114, forming a via hole in this interlayer insulating film, burying a conductive material in this via hole and forming a second upper layer interconnection.

Next, as shown in FIG. 8(e), the whole of support board 141 is removed by chemical etching or polishing so that the bottom surface of lower layer interconnection 112 is exposed. Next, high etching rate layer 112c is removed by etching. As a result of this, the interconnecting substrate of the embodiment shown in FIG. 1 can be obtained. One etching treatment is sufficient when the support board and the high etching rate layer are made of the same material.

Incidentally, in a case where etching barrier layer 112a is provided as the lowest layer without forming high etching rate layer 112c, the interconnecting substrate of the embodiment shown in FIG. 3 can be obtained after the removal of the support board by etching.

Because a conductive layer for interconnection is formed by the electrolytic plating method on the support board and in view of the ease with which the support board is removed after the formation of the interconnecting substrate, it is preferred that support board 141 be made of a conductive material, particularly from a metal material. The thickness of the support board can be set at 0.1 to 1 mm or so in order to ensure sufficient strength during and after the formation of the interconnecting substrate. If this thickness is to small, sufficient strength cannot be ensured. If this thickness is too large, the weight increases and handlability decreases. At the same time, a warpage and waviness become apt to occur in the substrate, and the formation of fine interconnections becomes difficult. The material for the support board is not limited to conductive materials and metal materials, and it is possible to use boards made of insulating materials, such as silicon wafer, glass, ceramics and resins. When a support board made of an insulating material is used, a conductive layer for interconnection can be formed by the electroless plating method after the formation of resist layer 142. In place of this method, a conductive layer for interconnection can be formed by the electrolytic plating method after the steps of forming resist layer 142 and then forming a conductive underlayer over it by a film forming method such as the electroless plating method, the sputtering method and the evaporation method.

By use of an interconnecting substrate formed as described above and by a well-known method, for example, as shown in FIG. 6 or FIG. 7 above, a semiconductor chip is mounted using a bump, an underfill is formed as required, and furthermore, sealing is performed with a mold resin if necessary, whereby a semiconductor package can be formed. The obtained semiconductor package can be mounted on an external board by a well-known method.

What is claimed is:

1. An interconnecting substrate, comprising:
    a base insulating film having a sunken section in a bottom surface thereof,
    a first interconnection provided in the sunken section,
    a via hole formed in the base insulating film, and
    a second interconnection which is connected to the first interconnection via a conductor within the via hole and is formed on a top surface of the base insulating film,
    wherein the interconnecting substrate comprises:
        a first interconnection pattern formed of the first interconnection which comprises at least a linear pattern which extends along a second direction orthogonal to a first direction, and
        a warpage-controlling pattern which is provided in the sunken section in the bottom surface of the base insulating film and is formed to suppress a warpage of the interconnecting substrate toward a bottom side on both sides of the first direction,
    wherein the first interconnection pattern has a component ratio of a Y-component extending along the second direction to an X-component extending along the first direction (Y/X) which is larger than 1 and the warpage-controlling pattern has a component ratio of the Y-component to the X-component (Y/X) which is smaller than 1.

2. The interconnecting substrate according to claim 1, wherein the component ratio (Y/X) of the first interconnection pattern is not less than 55/45.

3. The interconnecting substrate according to claim 1, wherein a bottom surface of the first interconnection is flush with the bottom surface of the base insulating film.

4. The interconnecting substrate according to claim 1, wherein a total pattern component ratio Y/X of the whole pattern comprising the warpage-controlling pattern and the first interconnection pattern is within the range of 70/30 to 30/70.

5. The interconnecting substrate according to claim 1, wherein the first interconnection pattern has an area ratio of a total of the linear pattern extending along the first direction and the linear pattern extending along the second direction to the whole first interconnection pattern which is not less than 60%.

6. The interconnecting substrate according to claim 1, wherein the warpage-controlling pattern is a linear pattern or a line and space pattern orthogonal to the second direction.

7. The interconnecting substrate according to claim 1, wherein the warpage-controlling pattern is made of the same material as the first interconnection pattern and has the same thickness as the first interconnection pattern.

8. The interconnecting substrate according to claim 1, wherein the warpage-controlling pattern comprises at least a pattern formed of a dummy interconnection provided in the sunken section in the bottom surface of the base insulating film.

9. The interconnecting substrate comprising substrate region units which correspond to the interconnecting substrates according to claim 1, wherein the substrate region units are formed so as to be arrayed in blocks.

10. The interconnecting substrate according to claim 9, further comprising, in a peripheral part of an array region of the substrate region units, a block pattern provided in the sunken section in the bottom surface of the base insulating film.

11. The interconnecting substrate according to claim 10, wherein the block pattern is made of the same material as the first interconnection pattern and has the same thickness as the first interconnection pattern.

12. The interconnecting substrate according to claim 9, comprising, as the warpage-controlling pattern, a first warpage-controlling pattern formed of a dummy interconnection provided within the substrate region unit and a second warpage-controlling pattern provided in a peripheral part of an array region of the substrate region units.

13. The interconnecting substrate according to claim 12, wherein the second warpage-controlling pattern comprises a pattern in which region units comprising a line and space pattern orthogonal to the second direction are arrayed in blocks.

14. The interconnecting substrate according to claim 1, wherein a bottom surface of the first interconnection is flush with the bottom surface of the base insulating film.

15. The interconnecting substrate according to claim 1, wherein a bottom surface of the first interconnection is in a position above the bottom surface of the base insulating film.

16. The interconnecting substrate according to claim 1, wherein the base insulating film is made of a heat-resistant resin.

17. The interconnecting substrate according to claim 1, wherein the base insulating film is made of a fiber-reinforced resin composite material.

18. The interconnecting substrate according to claim 1, further comprising a solder resist layer which is formed in such a manner as to cover part of the second interconnection and cause a remaining part thereof to be exposed.

19. The interconnecting substrate according to claim 1, further comprising one or more interconnection structure layer which comprises an insulating layer provided on a top surface side of the base insulating film, a via hole formed in the insulating layer, and an upper layer interconnection which is connected to a lower interconnection via a conductor within the via hole and is formed on a top surface of the insulating layer.

20. The interconnecting substrate according to claim 19, further comprising a solder resist layer which is formed in such a manner as to cover part of the upper layer interconnection and cause a remaining part thereof to be exposed.

21. An interconnecting substrate comprising:
a base insulating film having a sunken section in a bottom surface thereof,
a first interconnection provided in the sunken section,
a via hole formed in the base insulating film, and
a second interconnection which is connected to the first interconnection via a conductor within the via hole and is formed on a top surface of the base insulating film,
wherein the interconnecting substrate comprises
a first interconnection pattern formed of the first interconnection which comprises at least a linear pattern which extends along a second direction orthogonal to a first direction and has a component ratio of a Y-component extending along the second direction to an X-component extending along the first direction (Y/X) which is larger than 1, and
a warpage-controlling pattern which is provided in the sunken section in the bottom surface of the base insulating film and has a component ratio of the Y-component to the X-component (Y/X) which is smaller than 1.

22. A semiconductor device comprising the interconnecting substrate according to claim 1 and a semiconductor chip mounted on the interconnecting substrate.

23. The semiconductor device according to claim 22, wherein the semiconductor chip is mounted on a bottom surface side of the interconnecting substrate and is connected to the first interconnection.

24. An interconnecting substrate, comprising:
a base insulating film having a sunken section in a bottom surface thereof,
a first interconnection provided in the sunken section,
a via hole formed in the base insulating film, and
a second interconnection which is connected to the first interconnection via a conductor within the via hole and is formed on a top surface of the base insulating film,
wherein the interconnecting substrate comprises:
a first interconnection pattern formed of the first interconnection which comprises at least a linear pattern which extends along a second direction orthogonal to a first direction, and
a warpage-controlling pattern which is provided in the sunken section in the bottom surface of the base insulating film and is formed to suppress a warpage of the interconnecting substrate toward a bottom side on both sides of the first direction;
the warpage-controlling pattern is a line and space pattern orthogonal to the second direction; and
a total pattern component ratio of a Y-component extending along the second direction to an X-component extending along the first direction (Y/X) of the whole pattern comprising the warpage-controlling pattern and the first interconnection pattern is within the range of 70/30 to 30/70.

25. The interconnecting substrate according to claim 24, wherein the first interconnection pattern has an area ratio of a total of the linear pattern extending along the first direction and the linear pattern extending along the second direction to the whole first interconnection pattern which is not less than 60%.

26. The interconnecting substrate according to claim 24, wherein the warpage-controlling pattern is made of the same material as the first interconnection pattern and has the same thickness as the first interconnection pattern.

27. The interconnecting substrate according to claim 24, wherein the warpage-controlling pattern comprises at least a pattern formed of a dummy interconnection provided in the sunken section in the bottom surface of the base insulating film.

28. An interconnecting substrate comprising substrate region units which correspond to the interconnecting substrates according to claim 4, wherein the substrate region units are formed so as to be arrayed in blocks.

* * * * *